United States Patent [19]

Morgan

[11] Patent Number: 4,577,400

[45] Date of Patent: Mar. 25, 1986

[54] PIN INSERTION TOOL

[75] Inventor: Thomas A. Morgan, Billerica, Mass.

[73] Assignee: Honeywell Information Systems Inc., Waltham, Mass.

[21] Appl. No.: 576,071

[22] Filed: Feb. 1, 1984

[51] Int. Cl.[4] ............................................. H05K 3/30
[52] U.S. Cl. ....................................... 29/739; 29/747; 29/845
[58] Field of Search ................. 29/739, 741, 758, 764, 29/842, 845

[56] References Cited

U.S. PATENT DOCUMENTS

| | | |
|---|---|---|
| 3,074,155 | 1/1963 | Cootes et al. |
| 3,177,952 | 4/1965 | West .................... 173/121 |
| 3,279,044 | 10/1966 | Roper . |
| 4,070,755 | 1/1978 | Carter .................... 29/764 |
| 4,083,101 | 4/1978 | Coller .................... 29/739 |
| 4,206,543 | 6/1980 | Chisholm ............... 29/739 |
| 4,241,496 | 12/1980 | Gregson .................. 29/751 |
| 4,315,365 | 2/1982 | Wigby .................... 29/739 |

Primary Examiner—Carl E. Hall
Attorney, Agent, or Firm—Faith F. Driscoll; John S. Solakian

[57] ABSTRACT

A tool facilitates the hand insertion of wire wrap square sectioned pins from a fanning metal strip into plated through holes of a wire-wrap printed circuit board. The tool includes a solid cylindrical tip which is mounted within a handle member which includes an automatic anvil. An end portion of the tip has a portion with stepped profile which contains a round hole. The hole is slightly larger than the square section of the pin and has a predetermined depth for positioning the pin in a vertical direction during an insertion operation. The sizes of the individual steps are selected to enable the pins to be ejected completely from the band portions of the strip into the holes of the board at a predetermined depth without damaging the strip or the areas surrounding the holes.

27 Claims, 16 Drawing Figures

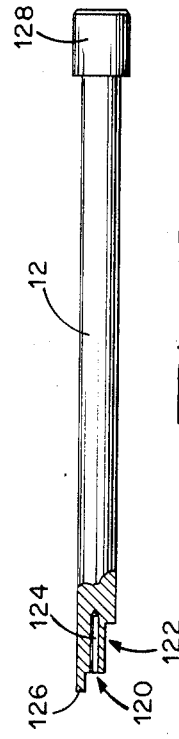
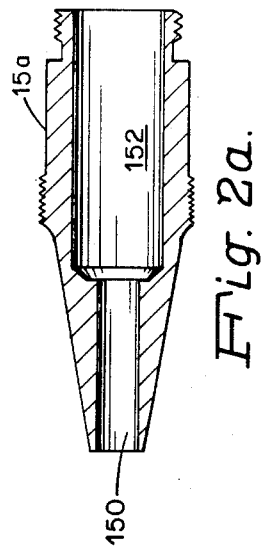
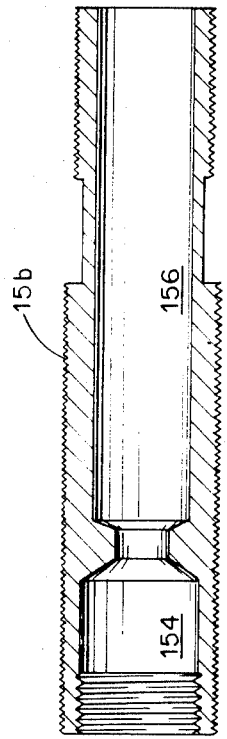
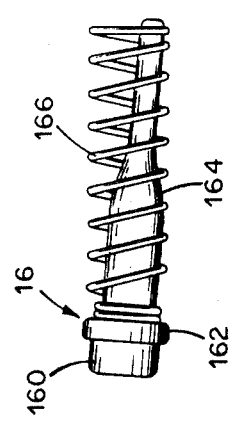
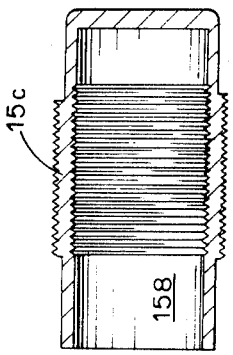
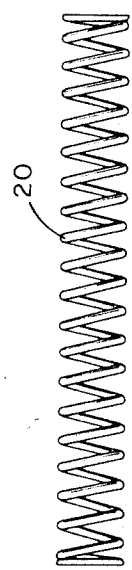

PIN INSERTION TOOL

BACKGROUND OF THE INVENTION

1. Field of Use

This invention pertains to a hand tool and more particularly to a hand tool for inserting wire-wrap pins into a wire-wrapped printed circuit board or a panel.

2. Prior Art

Wire-wrap is widely used as a convenient low cost method for prototype development and for short production runs using semiautomatic and automatic machines. It has been noted as offering the advantages of ease of design, freedom of layout, ease of maintenance and parts replacement, ease of design change, good performance and good density. Wire wrapping consists of winding a number of turns of wire around a metal pin or post having at least two sharp edges. Generally, metal pins with 0.025 inch square cross sections are employed.

It has been found that it is very difficult to insert wire-wrap pins into wire-wrap printed circuit boards or panels. Normally, the small pins are contained within a fanning strip. The user or operator removes the pins from the strip by hand and inserts each pin into a press. Then, the user positions the printed circuit board over the inserted pin and engages the press to stake or drive the pin into the board.

Generally, it requires several passes to get the press adjusted so that the pin is inserted at the right depth and angle without damage to the board. Further, since the pin is small as compared to the size of the board and press, it is very difficult to position the board at the correct attitude, so that the pin and hole into which the pin is to be inserted, are properly aligned.

From the foregoing, it is seen that the above procedure is extremely time consuming. Furthermore, pin insertion operations can only be performed in a facility which has press equipment. This necessitates maintenance personnel servicing computer equipment in the field to return those printed circuit boards requiring wiring changes to a control facility.

Accordingly, it is an object of the present invention to provide a tool which permits the installation of wire-wrap pins.

It is a further object of the present invention to provide a tool which allows wire-wrap pins to be easily and reliably installed.

SUMMARY OF THE INVENTION

The above and other objects of the present invention are achieved in a hand tool for inserting wire-wrap pins into a wire-wrap board or panel. A preferred embodiment of the tool comprises a solid cylindrical tip portion which is mounted within an automatic impact type handle member. The handle member of a preferred embodiment houses an automatic anvil which is spring actuated to deliver an impact to one end of the tip mounted within the handle.

In accordance with the invention, the other end of the tip which forms part of the unenclosed section of the tip external to the handle member has a stepped profile. Additionally, the section includes a hole having a diameter slightly larger than the square section of the particular size of wire-wrap pin and a predetermined depth for positioning the pin in a vertical direction during an insertion operation. The sizes of the individual steps are selected to enable the pins to be ejected completely from the strip and inserted into the holes of the board at a predetermined depth without damaging the strip or the areas surrounding the holes.

More particularly, the depth of the hole relative to the end of a first one of the steps which form the stepped profile end is selected to preestablish a predetermined depth to which each pin can be uniformly driven into the holes of the board. The distance from the center of the hole to the vertical or rising part of the first step is selected so as to enable the tubular section of the fanning strip surrounding each pin to clear the tool tip during an insertion operation. The depth of a second one of the steps is selected to allow the main section or band of the fanning strip to clear the tool tip during an insertion operation.

In operation, the tip of the tool is placed over the pin which is positioned over a selected hole in the printed circuit board while the pin is installed in the fanning strip. The strip is held in place by an operator's finger which results in the pin being vertically positioned in the hole of the tip. At that time, the operator presses the handle member down causing the anvil to deliver an impact to the end of the tip within the handle member. This forces the pin from the fanning strip and at the same time inserts the pin into the selected plated through hole on the printed circuit board at the predetermined depth. The tool permits pin insertion to take place without damage to the fanning strip or to the installation area surrounding the hole (e.g., surface mounted components, pads, etch, etc.).

From the above, it is seen that the hand tool of the present invention permits a wire-wrap pin to be installed in a printed circuit board in a single step operation without having to remove the pin from the fanning strip. Further, the hand tool eliminates the need for an operator to spend considerable time in aligning the pins before they can be installed in the board. The operator need only position each pin over the hole on the board and press down on the tool handle member. Also, since the hand tool is small enough so that it can be operated with one hand, the operator's other hand is left free to hold the board in a desired position.

Additionally, the tool of the present invention can also be used for extracting pins when an operator has access to the bottom of the printed circuit board. To facilitate extraction, the end of the tip is notched or indented to contain the end of the pin protruding from the bottom of the board. Extraction is accomplished by placing the end of the tip over the end of the pin and pressing down on the handle member. This causes the anvil to deliver an impact to the end of the tip which drives the pin out of the hole.

The novel features which are believed to be characteristic of the invention both as to its organization and method operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 2a through 2g show in greater detail, the different elements of the tool.

DESCRIPTION OF THE PREFERRED EMBODIMENT

Figure 1A:
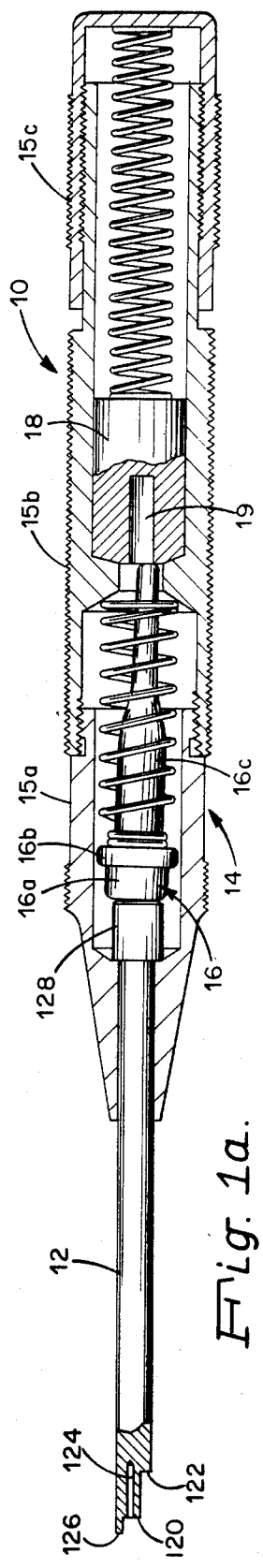
FIGS. 1a through 1c are enlarged partially longitudinal sectioned views of the hand tool of the present invention illustrating its internal operation.

The construction of the preferred embodiment of the hand tool 10 of the present invention will now be described with reference to FIGS. 1a through 5. Referring to FIG. 1a, it is seen that the tool 10 includes a solid tip element 12 and an automatic impact handle member 14. In the preferred embodiment, both element 12 and member 14 are constructed from steel material to minimize wear. The handle member 14 may be conventional in design. For example, a preferred embodiment of the handle member 14 may take the form of the handle manufactured by Starrett Corporation utilized with automatic center punches with adjustable stroke.

The handle 14 is constructed to have three cylindrical sections which correspond to a nose cone or front section 15a, a middle section 15b and an end section or cap 15c. Each of the sections 15a through 15c are threaded as shown so that each section screws into the next adjacent section.

The handle 14 further includes a front cylindrical piece 16 having shoulders 160 and 162 of different diameters and a tapered section 164. The piece 16 includes a special helical wound spring 166 which is mounted on the tapered section 164 as shown. As explained herein, the front piece 16 is held in an initial position by an eccentric characteristic of spring 166 which fits within a tapered portion of handle section 15b.

The handle 14 further includes an anvil 18 which at the end adjacent to section 16c has a round channel or hole 180 and a tapered face 182. The anvil 18 is held in contact with the end of section 16c by a helical wound compression spring 20, conventional in design, contained within the hollow cavity of section 15b.

In accordance with the principles of the present invention, a portion of the solid tip element 12, which is an integral part of tool 10, is mounted to slide longitudinally within the nose cone section 15a. The element 12 is contained within or prevented from falling out of the handle member by a shoulder section 128.

As seen from FIG. 1a, the end of tip 12 has a stepped profile formed by steps 120, 122 and 126. The vertical part of step 120 includes a hole or channel 124 which extends longitudinally into tip 12 for a predetermined distance. The bottom or end of hole or channel 124 is tapered to closely coincide with the taper of pointed ends of the pins 60 to prevent any damage to the ends of pins 60 during an insertion operation.

In the preferred embodiment, the channel 124 has a diameter of 0.036 inches and a depth of 0.150 inches. The channel 124 is used to position the wire-wrap pins of FIG. 6 in a vertical direction during an insertion operation. The diameter of channel 124 is slightly larger than the square section of the wire-wrap pins. The depth of channel 124 is sufficient to provide the desired vertical positioning of wire-wrap pins. However, the depth of channel 124 relative to the end of a first adjacent step 126 is selected to pre-establish the depth to which each wire-wrap pin is to be driven into one of the plated through holes contained in the wire-wrap printed circuit board. In the preferred embodiment, this depth is 0.125 inches.

Figure 6:
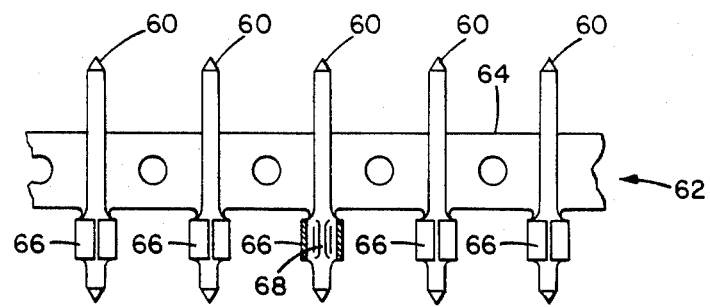
FIG. 6 is an enlarged view of a fanning strip or cartridge type band containing several wire-wrap pins.

Additionally, the distance from the center of the channel 24 to the vertical or rising part of step 120 is selected to enable the tubular section of the fanning strip or band of FIG. 6 of each wire-wrap pin to clear the tool tip 12 during an insertion of operation. In the preferred embodiment, the distance is 0.021 inches. The depth and length of a second adjacent step 122 (i.e., the vertical and horizontal portions, respectively, of the step) are selected to allow the main section or band 62 of the fanning strip 61 of FIG. 6 to clear the tool tip 12 during an insertion operation. In the preferred embodiment, the vertical depth distance is 0.036 inches and the longitudinal distance is 0.30 inches.

FIGS. 2a through 2g show in greater detail, each of the parts of tool 10. The parts of tool 10 are assembled in the order of FIGS. 2a through 2g.

In greater detail, FIG. 2b shows the solid tip 12 while the remaining FIGS. 2a and 2c through 2g show the different parts of handle member 14. The tip 12 is allowed to slide longitudinally within the different diameter chambers 150 and 152 of section 15a which serves to properly align tip 12.

As previously discussed, piece 16 of FIG. 2c fits within the tapered chamber or cavity 154 of section 15b of FIG. 2d. As seen from FIG. 2c, the helical wound spring 166 is specially wound so that the part close to the end of the spring is more tightly wound than the remainder of the spring. The spring 166 provides the illustrated eccentric characteristic to the smallest tapered part of section 164 of piece 16. The piece 16 forms an important part of the automatic mechanism for delivering the desired impact to tip 12 as discussed herein.

The anvil 18 fits into a second cylindrical chamber or cavity 156 of middle section 15b. It is held in place by spring 20. The cap 15c is installed over spring 20, and the spring 20 is allowed to move within cavity 156 and a cylindrical cavity 158 of section 15c. The spring 20 can be compressed as desired by screwing cap 15c down to any one of several positions depending upon how much force is desired for impact.

FIG. 6 illustrates the type of wire-wrap pins and packaging used with hand tool 10. As shown, the wire-wrap pins 60 are packaged in a metal fanning strip or cartridge belt 62. The strip 62 includes a body or band portion 64 and a number of tubular sections 66 which contain or hold the pins 60 as shown. Each wire-wrap pin 60 has a square cross-section and is pointed at both ends. The circumference of the lower portion of each pin 60 includes a plurality of protrusions 68 of a predetermined length. These protrusions form a star-shaped cross-section which is intended to engage the plated through holes in the wire-wrap printed circuit board as discussed herein. The wire-wrap pins 60 may be considered conventional in design. The preferred embodiment of hand tool 10 utilizes wire-wrap pins having a square cross-section of 0.0245 inches and a length of 0.5 inches.

DESCRIPTION OF OPERATION

Figure 3A:
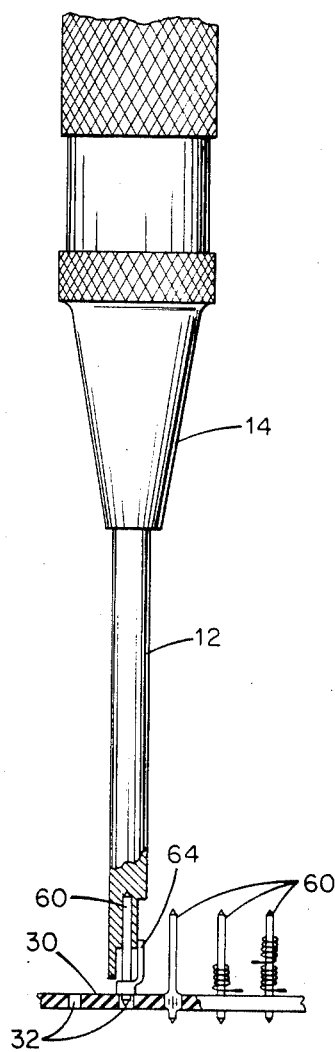
FIGS. 3a through 4b show a printed circuit board having several installed wire-wrap pins having one or more wire-wrapped conductors for explaining an insertion operation using the hand tool of FIG. 1.
Figure 4A:
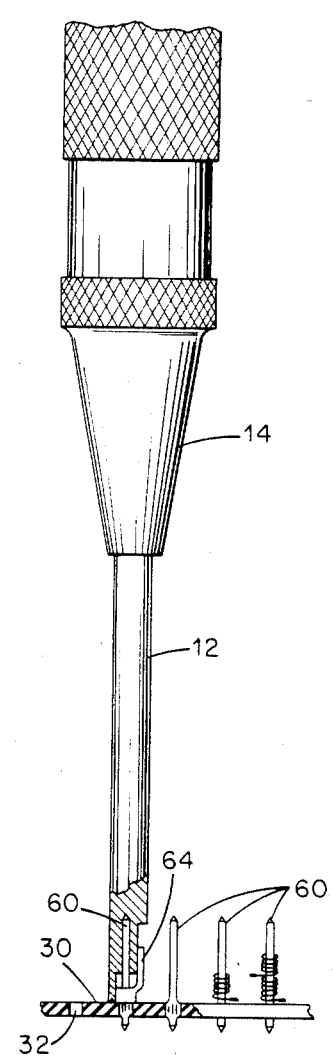

With reference to FIGS. 1a through 1c, 3a through 4b and 6, the operation of tool 10 will now be described in carrying out an insertion operation. Referring to FIG. 3a, it is that an operator holding the tool 10 in one hand places the tip 12 over a selected one of the pins 60 of fanning strip 62. The selected pin 60 is positioned over one of the unused holes 32 of wire-wrap printed circuit board 30 located at an area of board 30 which is being retrofited.

Figure 3B:
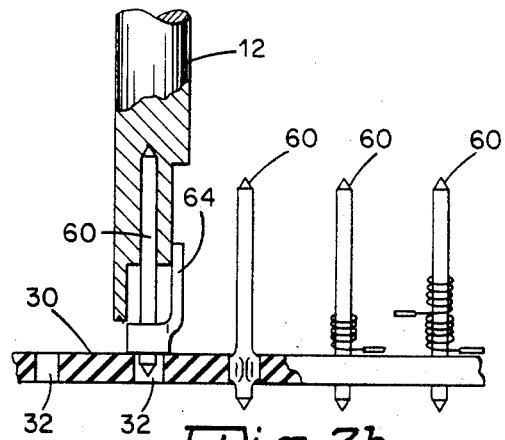
Figure 4B:
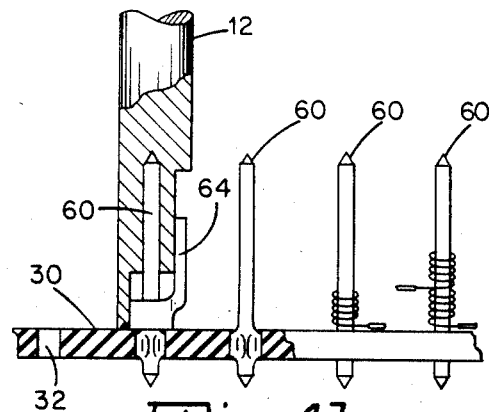

As the operator moves the tool down in a vertical direction, the pin 60 slides into hole or channel 124 as shown. At the same time, the operator positions the center or band portion 64 of strip 62 in a direction which is perpendicular to the pin 60 and tip 12 as shown. The operator then presses down on handle member 14 of tool 10 causing it to deliver an impact to tip 12. The impact is sufficient to drive the pin 60 out through its tubular section 66 and into the hole 32. This slides the center or band portion 64 of strip 62 along the vertical portion of step 122 to the position shown in FIG. 4a. The result is that pin 60 is completely ejected from its tubular section 66 and inserted into the hole 32 of board 30 at the desired depth without damage to strip 62 or to the surface mounted components, pads or etch surrounding hole 32 (not shown). The wire-wrap pin is firmly held in place at the desired depth in the plated through hole by the protrusions 68. The operator need only lift off the tool 10 and strip 62 in readiness for the next operation. FIGS. 3b and 4b illustrate the positioning of tool 10 and strip 62 in greater detail.

Figure 1B:
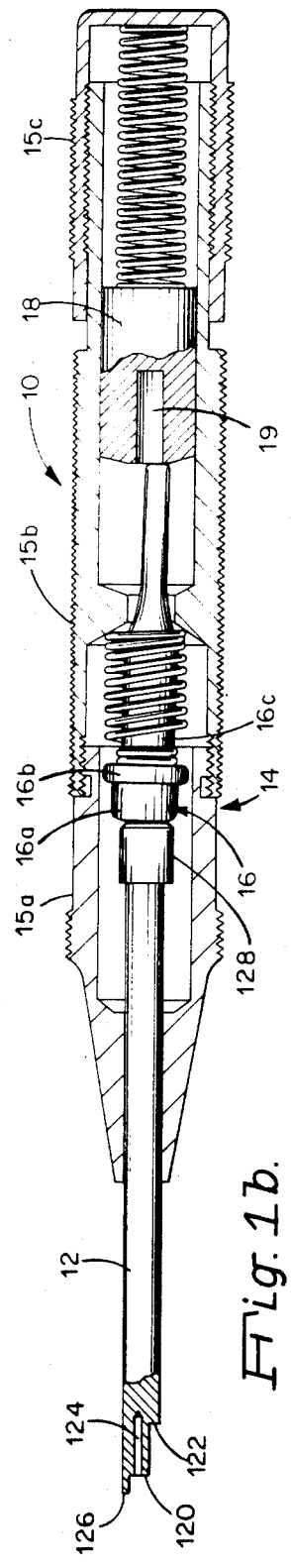
Figure 1C:
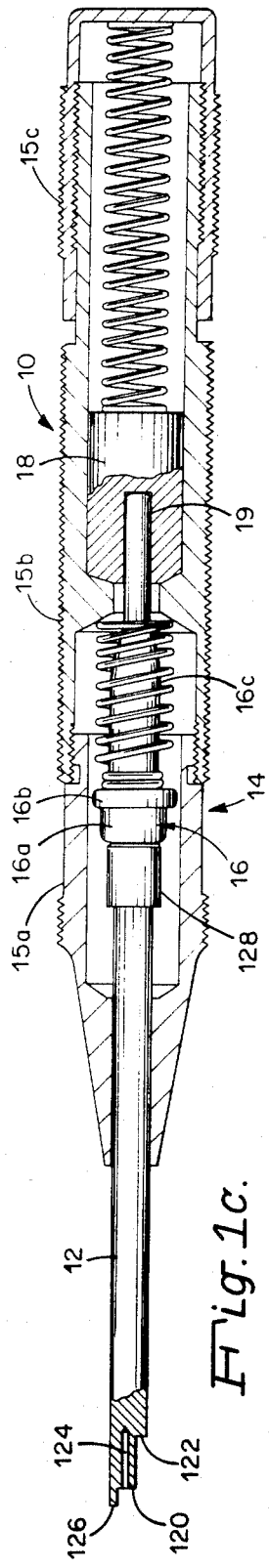

The internal operation of the tool 10, during an insertion operation, is shown in FIGS. 1a through 1c. When the operator places the tool 10 over pin 60, the tool 10 is in a rest position as shown in FIG. 1a. That is, the tapered end of section 164 of piece 16 is held against one side of the tapered face 182 of anvil 18 by the eccentricity of spring 166. As the operator continues to press down on handle member 14, this compresses both springs 166 and 20 as shown in FIG. 1b.

When handle member 14 is pressed down far enough, the eccentricity of spring 166 is overcome and the tapered end of section 164 falls into the cylindrical cavity 180 of anvil 18. At this time, the end of section 164 can be pressed all the way into cavity 180 as shown in FIG. 1c. This releases spring 20 which forces anvil 18 in a longitudinal direction so that it moves all the way to the left end of chamber 156 as shown. The result is that an impact is delivered to the right side of shoulder 128 of tip 12 forcing the tip 12 in the direction shown in FIG. 1c. When the impact is over and the tool is lifted from the surface of circuit board 30, the components of tool 10 will have resumed the positions shown in FIG. 1a.

From the above, it is seen how the hand tool of the preferred embodiment permits an operator to install wire-wrap pins within plated through holes of a wire-wrap printed circuit board at a uniform depth without damaging the strip containing the pins or to the surrounding installation areas of the board surface. An operator is able to perform pin insertion operations in a single step without having to remove the pins from their original packaging. Moreover, an operator can easily align the pins with the holes in the board with one hand while using the other hand to perform the insertion operation with the hand tool.

Because of the above convenience and ease of use, an operator can reliably install wire-wrap pins in the field or at any location where board wiring changes are required to be made. Also, the tool reduces considerably the amount of time to perform such operation. Also, such operations can be performed quickly and without damage to the printed circuit boards themselves.

Figure 5:
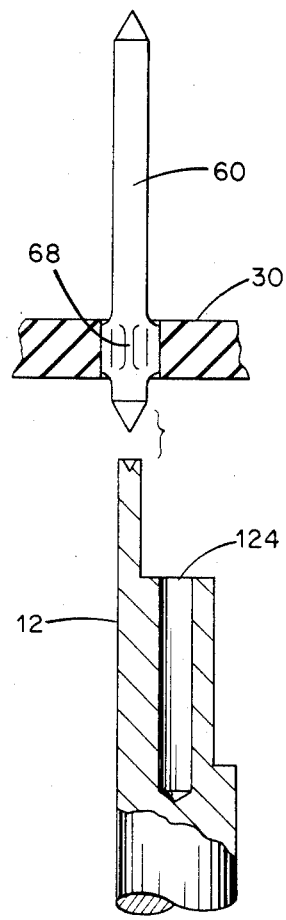
FIG. 5 is an enlarged view of the end of the tool of the invention used for extracting wire-wrap pins.

In addition to installing wire-wrap pins, the hand tool 10 can also be used to remove or eject such pins. This presumes that the operation has access to the bottom or underside part of the printed circuit board. Referring to FIG. 5, it is seen that the end 126 of tip 12 is notched as shown. An operator places the end 126 over the pointed end of the wire-wrap pin 60 from hole 32 accessible from the bottom of board 30 of FIG. 3a. When the operator presses down on handle member 14 far enough, an impact is delivered to tip 12 which is sufficient to eject pin 60 from hole 32 of board 30.

Those skilled in the art will appreciate that many changes may be made to the preferred embodiment without departing from its teachings. For example, the dimensions of the tool's tip may be altered to accommodate different size wire-wrap pins or similar items to be inserted into a wire-wrap printed circuit board or panel, etc. In fact, several different size tips may be made for use with a single handle member. Also, the tool tip may be used with panels or printed circuit boards of different construction and of varied thicknesses (e.g. single, multilayer, etc.).

Also, although the tip of the present invention was mounted within a handle member which utilizes an automatic impact mechanism such as used in automatic center punch tools, the invention may be utilized with other types of impact devices.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A hand tool for inserting wire-wrap pins contained within a fanning strip, said fanning strip having a band section and a number of tubular sections for containing said pins, into holes of a wire-wrap printed circuit board or panel, said tool comprising:
    a handle member including an automatic anvil and means for delivering an impact to said anvil; and,
    a solid cylindrical tip, one section of said tip being mounted within said handle member and coupled to said anvil for receiving said impact from said anvil during an insertion operation and another section extending beyond said handle member, one end of said other section farthest away from said handle member having a stepped profile including a plurality of steps, a first one of said steps 120 having a hole for vertically positioning each of said pins during said insertion operation, said hole having a bottom which is a predetermined longitudinal distance from the end of a first adjacent step for preestablishing a depth at which said each pin can be driven into a selected one of said holes in said board and said first step and a second adjacent step being dimensioned for receiving corresponding ones of said band and tubular sections, respectively, when ejecting each of said pins completely from said strip into said selected one of said holes without damage or deformation to said strip or to the surrounding installation area during said insertion operation.

2. The hand tool of claim 1 wherein each of said steps has vertical and horizontal parts and the distance from said vertical part of said first step to the center of said hole is selected so that each of said tubular sections clears said tip of said tool during said insertion operation.

3. The hand tool of claim 2 wherein the height of said vertical part of said second adjacent step is selected so that said band section of said strip clears said tip of said tool during said insertion operation.

4. The hand tool of claim 3 wherein said horizontal part of said second adjacent step is selected to extend a predetermined longitudinal distance for allowing said strip to move freely along said horizontal part of said second adjacent step clearing said tool tip during said insertion operation.

5. The hand tool of claim 1 wherein the bottom of said hole is tapered to coincide with the shape of each of said pins so as to prevent damage to said pins during said insertion operation.

6. The hand tool of claim 5 wherein said tip and said handle member are constructed of steel material.

7. The hand tool of claim 6 wherein each pin of said pins has a square cross section and a lower portion having a series of protrusions extending around the outside diameter of said each pin for firmly holding said pin in place at said predetermined depth within said hole.

8. The hand tool of claim 7 wherein said hole has a diameter which is slightly larger than pins.

9. The hand tool of claim 1 wherein said one section of said tip has a shoulder for holding said tip within said handle member.

10. The hand tool of claim 1 wherein the outermost end of said tip corresponding to the vertical part of said first adjacent step contains a notch having a predetermined shape for engaging one end of each of said pins inserted into different ones of said holes of said board or said panel for ejecting said pins from the underside part of said board or said panel.

11. A tool tip for inserting wire-wrap pins packaged in a fanning strip, said fanning strip having a band section and a number of tubular sections for containing said pins, into holes of a printed circuit board or panel for use with an automatic handle member including an automatic anvil and means for delivering an impact to said anvil, said tool tip comprising:

a solid cylindrical tip, one section of said tip being mounted within said handle member and coupled to said anvil for receiving said impact from said anvil during an insertion operation and another section extending beyond said handle member, one end of said other section having a stepped profile including a plurality of steps, a first one of said steps having a hole for vertically positioning each of said pins during said insertion operation, said hole having a bottom which is a predetermined longitudinal distance from the end of a first adjacent step for preestablishing a depth at which said each pin is driven into a selected one of said holes and said first step and a second adjacent step being dimensioned for receiving corresponding ones of said band and tubular sections, respectively, when ejecting each of said pins completely from said strip into said selected one of said holes without damage or deformation to said strip or to the surrounding installation area during said insertion operation.

12. The hand tool of claim 11 wherein each of said steps has vertical and horizontal parts and the distance from said vertical part of said first step to the center of said hole is selected so that each of said tubular sections clears said tip of said tool during said insertion operation.

13. The hand tool of claim 12 wherein the height of said vertical part of said second adjacent step is selected so that said band section of said strip clears said tip of said tool during said insertion operation.

14. The hand tool of claim 13 wherein said horizontal part of said second adjacent step is selected to extend a predetermined longitudinal distance for allowing said strip to move freely along said horizontal part of said second adjacent step clearing said tool tip during said insertion operation.

15. The hand tool of claim 11 wherein the bottom of said hole is tapered to coincide with the shape of each of said pins so as to prevent damage to said pins during said insertion operation.

16. The hand tool of claim 15 wherein said tip and said handle member are constructed of steel material.

17. The hand tool of claim 16 wherein each pin of said pins has a square cross section and a lower portion having a series of protrusions extending around the outside diameter of said each pin for firmly holding said pin in place at said predetermined depth within said hole.

18. The hand tool of claim 17 wherein said hole has a diameter which is slightly larger than pins.

19. The hand tool of claim 11 wherein said one section of said tip has a shoulder for holding said tip within said handle member.

20. The hand tool of claim 11 wherein the outermost end of said tip corresponding to the vertical part of said first adjacent step contains a notch having a predetermined shape for engaging one end of each of said pins inserted into different ones of said holes of said board or said panel for ejecting said pins from the underside part of said board or said panel.

21. A hand tool for inserting wire-wrap pins into plated through holes of a printed circuit board, said pins being contained in tubular sections of a fanning strip extending below a band section of said fanning strip, said tool comprising:

a handle including an automatic anvil means for delivering an impact to said anvil upon being depressed; and, a solid cylindrical tip having first and second sections, said first section being enclosed within said handle and having a shoulder at one end for holding said tip within said handle, said shoulder being coupled to said anvil for receiving said impact during an insertion operation upon said handle being depressed; and, said second section being external to said handle, one end of said second section having a stepped profile formed by at least, first adjacent, and second adjacent steps, a vertical part of said first step including a channel having a bottom which is a predetermined longitudinal distance from the end of said first adjacent step and said steps being dimensioned for receiving corresponding ones of said band and tubular sections, respectively, when driving each pin placed into a selected hole to a uniform hole depth in response to said impact applied to said shoulder when said tip is positioned over said pin vertically aligning said pin within said channel during said insertion operation, said pin being inserted at said uniform depth without damage to said pin, to said band section or to a surface area surrounding said hole.

22. The hand tool of claim 21 wherein the distance from said vertical part of said first step to the center of said channel is selected so that each of said tubular sections clears said tip of said tool during said insertion operation.

23. The hand tool of claim 22 wherein the height of a vertical part of said second adjacent step is selected so that said band section of said strip clears said tip of said tool during said insertion operation.

24. The hand tool of claim 23 wherein a horizontal part of said second adjacent step is selected to extend a predetermined longitudinal distance for allowing said strip to move freely along said horizontal part of said second adjacent step clearing said tool tip during said insertion operation.

25. The hand tool of claim 21 wherein the bottom of said hole is tapered to coincide with the shape of each of said pins so as to prevent damage to said pins during said insertion operation.

26. The hand tool of claim 25 wherein each pin of said pins has a square cross section and a lower portion having a series of protrusions extending around the outside diameter of said each pin for firmly holding said pin in place at said predetermined depth within said hole.

27. The hand tool of claim 21 wherein the outermost end of said tip corresponding to the vertical part of said first adjacent step contains a notch having a predetermined shape for engaging one end of each of said pins inserted into different ones of said holes of said board for ejecting said pins from the underside part of said board.

* * * * *